(12) United States Patent
Onoue et al.

(10) Patent No.: US 7,932,177 B2
(45) Date of Patent: Apr. 26, 2011

(54) FIELD-EFFECT TRANSISTOR

(75) Inventors: Tomoaki Onoue, Yasu (JP); Takeshi Yasuda, Tsukuba (JP); Tetsuo Tsutsui, Kasuga (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 133 days.

(21) Appl. No.: 12/199,446

(22) Filed: Aug. 27, 2008

(65) Prior Publication Data

US 2009/0095954 A1    Apr. 16, 2009

Related U.S. Application Data

(63) Continuation of application No. PCT/JP2007/051557, filed on Jan. 31, 2007.

(30) Foreign Application Priority Data

Feb. 27, 2006    (JP) ................... 2006-050245

(51) Int. Cl.
    *H01L 21/4763* (2006.01)
(52) U.S. Cl. ..................................... 438/637
(58) Field of Classification Search .......... None
    See application file for complete search history.

(56) References Cited

U.S. PATENT DOCUMENTS 7,286,281 B2 * 10/2007 Lee et al. .................... 359/296
7,399,989 B2 *  7/2008 Moriya et al. ............... 257/40

FOREIGN PATENT DOCUMENTS

| JP | 2004-72049 | 3/2004 |
|---|---|---|
| JP | 2005-26698 | 1/2005 |
| JP | 2005-72569 | 3/2005 |
| JP | 2005-175386 | 6/2005 |
| WO | 03/041185 | 5/2003 |

OTHER PUBLICATIONS

Parylene Coating Services, Inc.; "Properties of Parylene"http://www.paryleneinc.com/pdf/PDS_Dimer_International.pdf.*
Knovel; 2004 MatWeb;Kipp, Dale O.; Diviision of Automation Creation ,Inc.; "Plastic Material Data Sheets".*
Yasuda et al., "Organic Field-Effect Transistors with Gate Dielectric Films of Poly-p-Xylylene Derivatives Prepared by Chemical Vapor Deposition," *Jpn. J. Appl. Phys.* vol. 42, pp. 6614-6618 (2003).

(Continued)

*Primary Examiner* — Charles Garber
*Assistant Examiner* — André C Stevenson
(74) *Attorney, Agent, or Firm* — Keating & Bennett, LLP

(57) ABSTRACT

A field-effect transistor is provided, which includes an organic thin film and which can realize a low threshold voltage while a stable, high field-effect mobility is ensured at the same time. In a field-effect transistor provided with a gate electrode, a source electrode, a drain electrode, a semiconductor film, a gate insulating film, and a substrate, the gate insulating film is formed from a plurality of insulating layers. Here, a first insulating layer in contact with the semiconductor film is formed from poly-p-xylylene formed into a film by a CVD method. A second insulating layer is formed from, for example, cyanoethylpullulan, and the dielectric constant is specified to be higher than that of the first insulating layer.

8 Claims, 8 Drawing Sheets

OTHER PUBLICATIONS

Veres, et al., "Low-k Insulators as the Choice of Dielectrics in Organic Field-Effect Transistors," *Advanced Functional Materials*, vol. 13, No. 3, pp. 199-204 (2003).

Onoue et al., "Low-Operating-Voltage Organic Field-Effect Transistors with Poly-p-Xylylene/High-k Polymer Bilayer Gate Dielectric", Japanese Journal of Applied Physics, Japan Society of Applied Physics, Japan, vol. 45., No. 29., Jul. 21, 2006, pp. L770-L772.

Official Communication issued in corresponding European Patent Application No. 07713728.9, issued on Jan. 18, 2011.

* cited by examiner

FIELD-EFFECT TRANSISTOR

CROSS-REFERENCE TO RELATED APPLICATIONS

This is a continuation under 35 U.S.C. §111(a) of PCT/JP2007/051557 filed Jan. 31, 2007, and claims priority of JP2006-050245 filed Feb. 27, 2006, both incorporated by reference.

BACKGROUND

1. Technical Field

The present disclosure relates to a field-effect transistor. In particular, the present disclosure relates to a field-effect transistor including an organic thin film.

2. Background Art

Organic devices have been studied actively because the organic devices feature light weight and flexibility and, in addition, there is a possibility that they can be produced inexpensively as compared with silicon semiconductor devices.

For example, practical use of the field-effect transistor (FET) including an organic thin film and taking advantage of these features for display devices, e.g., liquid crystal or organic electroluminescence displays, and other electronic apparatuses is expected. However, many problems to be solved remain in that, for example, the carrier mobility is low, the threshold voltage is high so as to increase the drive voltage, and characteristics deteriorate in the air.

It is known that the threshold voltage of a transistor can be lowered by using a high dielectric constant material for a gate insulating film in an organic thin film field-effect transistor and, thereby, a drive voltage of a device including this can be lowered. On the other hand, there are problems, in that an energetic disorder can occur at an interface, and an on-off ratio of a device can decrease because of an increase in leakage current.

In order to solve these problems, a structure has been proposed in which a gate insulating film is allowed to have a multilayer structure; and an upside insulating layer having a high insulating property and high affinity with a semiconductor film is laminated on a downside insulating layer formed from a high dielectric constant material (refer to Patent Document 1, for example). Patent Document 1 describes that an organic thin film field-effect transistor having a high charge mobility and a low threshold voltage can be obtained on the basis of the above-described structure.

However, regarding the transistor described in Patent Document 1, the upside insulating layer is formed by applying a polymer solution, in which polyvinyl phenol, polyvinyl alcohol, polymethyl methacrylate, or the like is dissolved, on the downside insulating layer. Consequently, the downside insulating layer is limited to a material which is not dissolved by a solvent contained in the polymer solution, and, for example, there is a problem in that cyanoethylpullulan known as a high dielectric constant material cannot be used as the material for the downside insulating layer. Furthermore, since a solvent is used for film formation of the upside insulating layer, there is a high possibility that impurities are mixed into this upside insulating layer, and this may cause deterioration of the characteristics of the resulting device.

On the other hand, it is known that a film having a low content of impurity can be obtained by using poly-p-xylylene formed into a film by a chemical vapor deposition method (CVD method) as a gate insulating film and, therefore, a high field-effect mobility can be obtained (refer to Non-Patent Document 1, for example). However, since poly-p-xylylene has a low relative dielectric constant (the relative dielectric constant at 1 kHz is about 3.2), there is a problem in that the threshold voltage increases.

Patent Document 1: Japanese Unexamined Patent Application Publication No. 2005-26698

Non-Patent Document 1: Takeshi Yasuda, three other members, "Organic Field-Effect Transistors with Gate Dielectric Films of Poly-p-Xylylene Derivatives Prepared by Chemical Vapor deposition", Jpn. J. Appl. Phys., The Japan Society of Applied Physics, October 2003, Vol. 42 (2003), Part 1, No. 10, pp. 6614-6618

Accordingly, it is desired to provide a field-effect transistor which includes an organic thin film and which can realize a low threshold voltage while a high field-effect mobility is ensured at the same time.

SUMMARY

The present inventors have found that the presence of poly-p-xylylene merely in a portion in contact with a semiconductor film is enough for obtaining the beneficial effects of poly-p-xylylene formed into a film by a CVD method.

For more details, the present disclosure is directed to a field-effect transistor provided with a gate electrode, a source electrode, a drain electrode, a semiconductor film which is disposed in such a way as to contact the source electrode and the drain electrode and which is formed from an organic semiconductor material, a gate insulating film disposed between the gate electrode and the semiconductor film, and a substrate for holding the gate electrode, the source electrode, the drain electrode, the semiconductor film, and the gate insulating film and is characterized by having the following configuration in order to solve the above-described technical problems.

That is, the gate insulating film is provided with a plurality of insulating layers including at least a first insulating layer disposed in such a way as to contact the semiconductor film, and the first insulating layer is formed from poly-p-xylylene formed into a film by a chemical vapor deposition method.

Preferably, the gate insulating film is provided with a second insulating layer having a dielectric constant higher than that of the above-described first insulating layer. In this case, it is preferable that the second insulating layer is formed from cyanoethylpullulan. Furthermore, the second insulating layer may contain a metal oxide powder.

It is preferable that the thickness of the first insulating layer is 50 nm or more.

Regarding the gate insulating film, poly-p-xylylene constituting the first insulating layer disposed in such a way as to contact the semiconductor film has an advantage that the insulating property is high to begin with. Furthermore, film formation of the first insulating layer is conducted by the CVD method and no solvent is used in the film formation. Therefore, contamination of impurities can be reduced. Moreover, regarding insulating layers other than the first insulating layer included in the gate insulating film, even a material easily affected by a solvent can be used without problems. For example, high relative dielectric constant cyanoethylpullulan can be used as a material for the second insulating layer without problems. Furthermore, an occurrence of diffusion of impurities, which may be contained in the insulating layers other than the first insulating layer provided in the gate insulating film, into the semiconductor film is effectively blocked by the first insulating layer.

Consequently, regarding the field-effect transistor, the on-off ratio can be increased while a stable, high field-effect mobility provided by poly-p-xylylene is ensured. Furthermore, variations in characteristics of the produced field-effect transistors between devices can be reduced.

Moreover, there is also an economical advantage that regarding a CVD material used for forming the poly-p-xylylene film by the CVD method, a high purity material can be easily commercially available.

In the disclosed FET, in the case where the gate insulating film is provided with the second insulating layer having a dielectric constant higher than that of the first insulating layer, the dielectric constant of the whole gate insulating film can increase. Therefore, the threshold voltage can be lowered. In the case where a high dielectric constant is desired as described above, if cyanoethylpullulan is used as a material for the second insulating layer, the second insulating layer having a high dielectric constant can be formed easily by a coating method and, in addition, a favorable smoothness of the surface of the second insulating layer is obtained. If the second insulating layer is allowed to contain a metal oxide powder, the dielectric constant of the second insulating layer can further increase, and the threshold voltage can be further lowered.

By the way, in the case where the advantage of good smoothness of the surface of the second insulating layer is not desired, a higher dielectric constant can be provided by forming the second insulating layer from cyanoethylpullulan containing a metal oxide powder.

In the FET, if the thickness of the first insulating layer is 50 nm or more, the above-described impurity blocking effect due to the first insulating layer can be effected more reliably.

Other features and advantages will become apparent from the following description of embodiments, which refers to the accompanying drawings.

DETAILED DESCRIPTION

Figure 1:
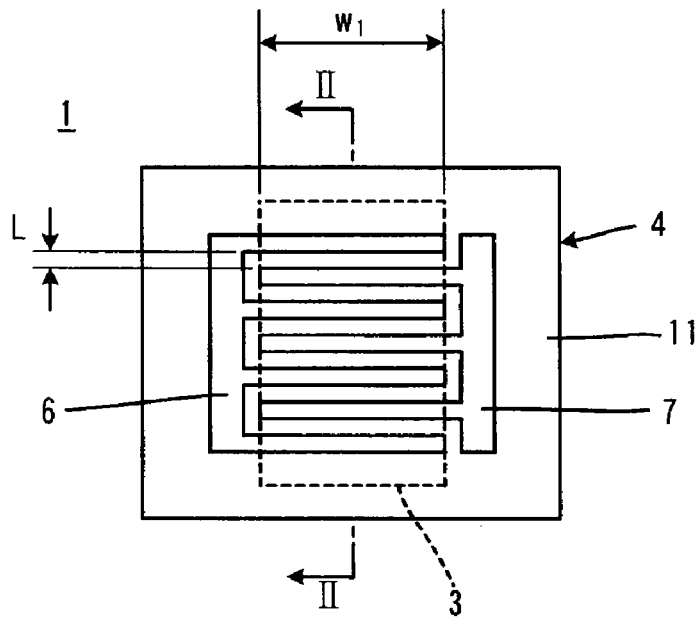
FIG. 1 is a plan view showing a field-effect transistor 1 according to a first embodiment of the present invention.
Figure 2:
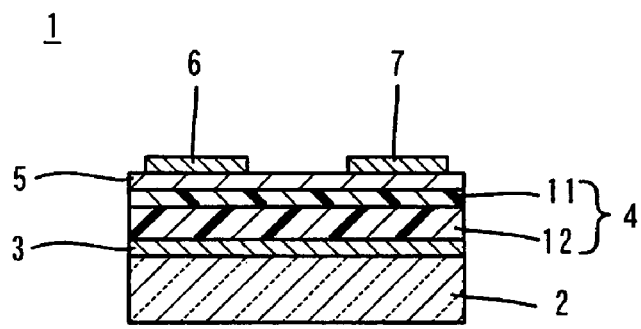
FIG. 2 is a magnified partial view of a section taken along the line II-II of FIG. 1.

Reference Numerals 1, 1a, 1b, 1c field-effect transistor 2 substrate 3 gate electrode 4 gate insulating film 5 semiconductor film 6 source electrode 7 drain electrode 11 first insulating layer 12 second insulating layer FIG. 1 is a plan view showing a field-effect transistor 1 according to a first embodiment of the present invention. FIG. 2 is a magnified partial view of a section taken along the line II-II of FIG. 1.

The field-effect transistor 1 is provided with a substrate 2 formed from, for example, glass. A gate electrode 3 formed from, for example, gold or a metal primarily containing gold is disposed on the substrate 2. In FIG. 1, the two-dimensional shape of the gate electrode 3 is indicated by a broken line. A gate insulating film 4 is disposed on the substrate 2 in such a way as to cover the gate electrode 3. The gate insulating film 4 will be described later in detail. A semiconductor film 5 formed from an organic semiconductor material, e.g., pentacene or a polyfluorene-thiophene copolymer, is disposed on the gate insulating film 4.

A source electrode 6 and a drain electrode 7 formed from, for example, gold or a metal primarily containing gold is disposed on the semiconductor film 5. As shown in FIG. 1 clearly, the source electrode 6 and the drain electrode 7 take on mutually opposed interdigital shapes, and are arranged interdigitating with each other. This is for the purpose of maximizing a channel width W in a limited area. By the way, when a width of interdigitation of each finger of the source electrode 6 and the drain electrode 7 is assumed to be $w_1$, regarding the electrodes shown in FIG. 1, the channel width W is represented by an equation, $W = w_1 \times 6$, because 6 pairs of fingers are opposed. Furthermore, the channel length is a dimension indicated by L shown in FIG. 1.

In such a field-effect transistor 1, the above-described gate insulating film 4 is characterized by being provided with a plurality of insulating layers including at least a first insulating layer 11 disposed in such a way as to contact the semiconductor film 5, wherein the first insulating layer 11 is composed of poly-p-xylylene, e.g., polydichloro-p-xylylene, formed by a CVD method in which a cyclophane, e.g., dichloro(2,2)-p-cyclophane, is used as a CVD material. Here, as for poly-p-xylylene, for example, A to F shown in Table 1 as described below can be used.

TABLE 1

Example of poly-p-xylylene

| | |
|---|---|
| A | —(CH$_2$—⟨C$_6$H$_4$⟩—CH$_2$)$_n$— |
| B | —(CH$_2$—⟨C$_6$H$_3$Cl⟩—CH$_2$)$_n$— |
| C | —(CH$_2$—⟨C$_6$H$_2$Cl$_2$⟩—CH$_2$)$_n$— |
| D | —(CF$_2$—⟨C$_6$H$_4$⟩—CF$_2$)$_n$— |
| E | —(CH$_2$—⟨C$_6$H$_3$F⟩—CH$_2$)$_n$— |
| F | —(CF$_2$—⟨C$_6$H$_3$(C$_2$H$_5$)⟩—CF$_2$)$_n$— |

The gate insulating film 4 is also provided with a second insulating layer 12 having a dielectric constant higher than that of the first insulating layer 11. As described above, film formation of the first insulating layer 11 is conducted by the CVD method and no solvent is used in the film formation. Therefore, regarding the second insulating layer 12, even a material easily affected by a solvent can be used without problems. Consequently, for example, cyanoethylpullulan can be used as a material for the second insulating layer 12 with advantage. Since a film can be formed from a single component polymer solution containing no particle by using cyanoethylpullulan, the second insulating layer 12 is allowed to become a film exhibiting good smoothness. In order to obtain high dielectric constant, the second insulating layer 12 may be formed from a resin containing a metal oxide powder, e.g., a barium titanate powder. In this case, if the above-described advantage that a film exhibiting good smoothness is formed is not desired, cyanoethylpullulan containing a metal oxide powder may be used as the material for the second insulating layer 12.

Regarding such a gate insulating film 4, as described above, poly-p-xylylene constituting the first insulating layer 11 is formed into a film by the CVD method, no solvent is used, and a high purity source material is easily available. Therefore, the first insulating layer 11 is allowed to become a film having a low impurity content, and a stable high field-effect mobility can be ensured. Furthermore, the second insulating layer can be provided with a high dielectric constant and, thereby, the threshold voltage can be lowered. Moreover, an occurrence of mixing of impurities, which may be contained in the second insulating layer 12 provided in the gate insulating film 4, into the semiconductor film 5 is blocked by the first insulating layer 11 effectively, so that the on-off ratio can be increased.

By the way, as shown in the drawing, it is preferable that the thickness of the second insulating layer 12 is larger than the thickness of the first insulating layer 11. The reason for this is that the dielectric constant of the whole gate insulating film 4 can be maintained at a higher level easily. However, it is preferable that the thickness of the first insulating layer 11 is 50 nm or more. The reason for this is that if such a thickness is selected, the above-described impurities, which may be contained in the second insulating layer 12, are blocked by the first insulating layer 11 more reliably, and an occurrence of mixing into the semiconductor film 4 is prevented more reliably.

Figure 3:
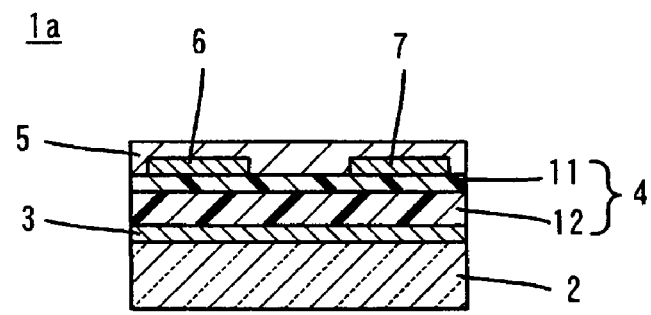
FIG. 3 is a diagram showing a field-effect transistor 1a according to a second embodiment of the present invention and corresponding to FIG. 2.
Figure 4:
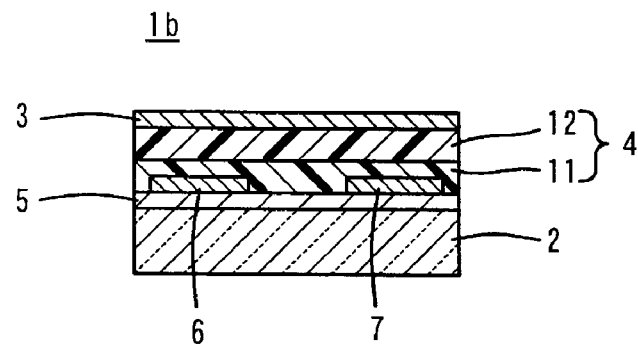
FIG. 4 is a diagram showing a field-effect transistor 1b according to a third embodiment of the present invention and corresponding to FIG. 2.
Figure 5:
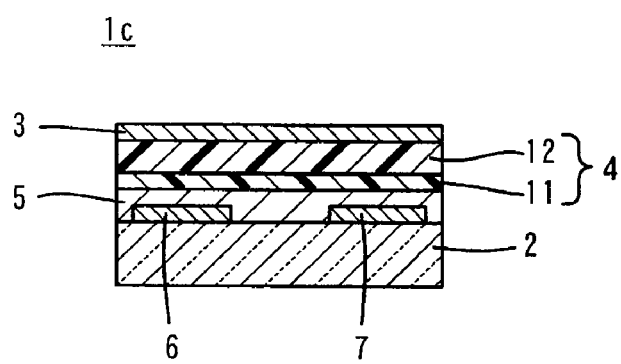
FIG. 5 is a diagram showing a field-effect transistor 1c according to a fourth embodiment of the present invention and corresponding to FIG. 2.

FIG. 3, FIG. 4, and FIG. 5 are diagrams showing field-effect transistors 1a, 1b, and 1c, respectively, according to the second, the third, and the fourth embodiments, respectively, of the present invention and corresponding to FIG. 2. In FIG. 3 to FIG. 5, the elements corresponding to the elements shown in FIG. 2 are indicated by the same reference numerals as those in FIG. 2, and explanations thereof are not repeated hereafter.

In the field-effect transistors 1a, 1b, and 1c shown in FIG. 3 to FIG. 5, the orders of lamination of elements, e.g., the gate electrode 3 and the semiconductor film 5, are different from that in the field-effect transistor 1 shown in FIG. 2. However, these field-effect transistors 1a, 1b, and 1c are commonly characterized in that the semiconductor film 5 is disposed in such a way as to contact the source electrode 6 and the drain electrode 7, the gate insulating film 4 is disposed between the gate electrode 3 and the semiconductor film 5, and the first insulating layer 11 is disposed in such a way as to contact the semiconductor film 5.

The field-effect transistor according to the present invention will be more specifically described below with reference to the experimental examples. Here, samples which are prepared in the experimental examples and which are according to the examples within the scope of the present invention have a laminated structure as shown in FIG. 2.

1. EXPERIMENTAL EXAMPLE 1

In Experimental example 1, pentacene was used as the material for a semiconductor film, and a sample related to each of Example 1 within the scope of the present invention and Comparative examples 1 and 2 out of the scope of the present invention was prepared.

1-1. EXAMPLE 1

(1) Formation of Gate Insulating Film

A glass substrate provided with a gate electrode formed from gold was spin-coated with a solution (15 percent by weight) in which cyanoethylpullulan was dissolved into dimethylformamide:acetone=9:1 (weight ratio). Thereafter, heating was conducted at 100° C. for 1 hour so as to form a second insulating layer having a thickness of 800 nm composed of cyanoethylpullulan (relative dielectric constant was 15.4 at 1 kHz).

A first insulating layer having a thickness of 50 nm composed of polydichloro-p-xylylene (relative dielectric constant was 3.2 at 1 kHz) serving as poly-p-xylylene was formed on the above-described second insulating layer by the CVD method, in which dichloro(2,2)-p-cyclophane serving as cyclophane was used as a source material, at a reduced pressure of about $1.0 \times 10^{-2}$ Pa under the condition that the vaporization temperature of the raw material was 125° C., the decomposition temperature was 630° C., and the substrate temperature was room temperature.

(2) Formation of Semiconductor Film

A semiconductor film having a thickness of 40 nm was formed on the above-described first insulating layer by evaporating pentacene at a reduced pressure of about $1.3 \times 10^{-4}$ Pa in terms of degree of vacuum under the condition that the rate was 0.3 Å/sec and the substrate temperature was room temperature.

(3) Formation of Source and Drain Electrodes

A stainless steel mask was prepared in such a way that the channel length L became 75 μm, the width $w_1$ of interdigitation of a finger portion of the source electrode and a finger portion of the drain electrode became 5 mm, 49 pairs of fingers were opposed, and the channel width W became 5 mm×49=245 mm. This mask was disposed on the above-described semiconductor film, gold was evaporated at a reduced pressure of about $6.5 \times 10^{-4}$ Pa in terms of degree of vacuum under the condition that the rate was 1.0 Å/sec and the substrate temperature was 25° C. so as to form a source electrode and a drain electrode which had thicknesses of 30 nm and, thereby, obtain a field-effect transistor.

Here, three field-effect transistors related to Samples 1 to 3 having the same structure were prepared through the same steps at the same time.

(4) Evaluation

Figure 6:
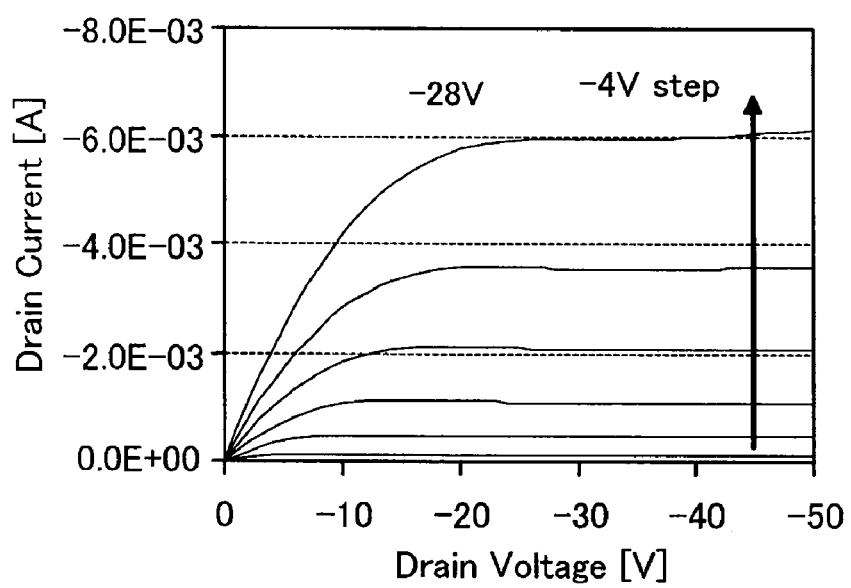
FIG. 6 is a diagram showing an output characteristic of a field-effect transistor according to Example 1.
Figure 7:
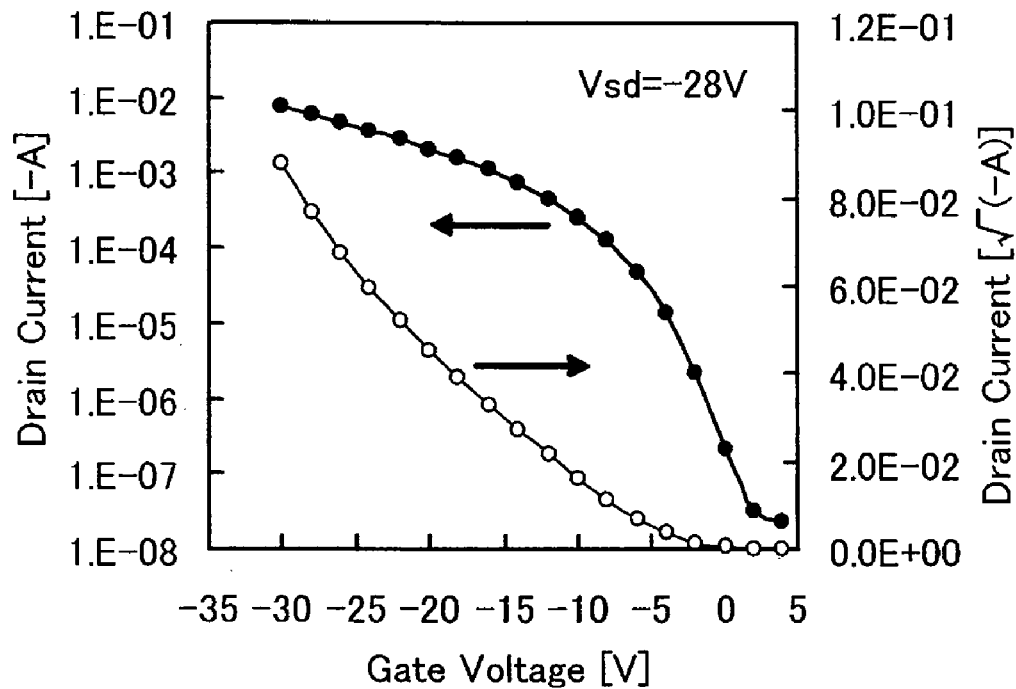
FIG. 7 is a diagram showing a transfer characteristic of the field-effect transistor according to Example 1.

The current-voltage characteristic of the resulting field-effect transistor was measured by using a semiconductor parameter analyzer ("4156C" produced by Agilent) so as to obtain the output characteristic shown in FIG. 6. The relationship between the gate voltage and the drain current in a saturation region based on the result of the output characteristic is indicated as the transfer characteristic shown in FIG. 7. The field-effect mobility μFET and the threshold voltage $V_t$ were calculated from FIG. 7 by using Formula 1 described below, and values of μFET=0.38 cm²/Vs and the threshold voltage $V_t$=−5.4 V were obtained.

$$I_d = (W/2L)C_i \mu (V_g - V_t)^2 \quad (1)$$

Here, $I_d$ represents a drain current, W represents a channel width, L represents a channel length, $V_g$ represents a gate voltage, $C_i$ represents a gate capacitance per unit area, μ represents a field-effect mobility, and $V_t$ represents a threshold voltage.

Furthermore, a ratio of a maximum value (on-current) of the drain current to a minimum value (off-current), that is, an on-off ratio, was $3.7 \times 10^4$.

Furthermore, Table 2 described below shows variations between field-effect transistors related to Samples 1 to 3 prepared at the same time.

TABLE 2

| Sample No. | Gate voltage at minimum drain current (V) | Minimum value of drain current (A) |
| --- | --- | --- |
| 1 | 2 | $2.1 \times 10^{-7}$ |
| 2 | 0 | $7.3 \times 10^{-6}$ |
| 3 | 0 | $7.1 \times 10^{-6}$ |

1-2. COMPARATIVE EXAMPLE 1

(1) Formation of Gate Insulating Film to (3) Formation of Source and Drain Electrodes A field-effect transistor was prepared in a manner similar to that in Example 1 except that merely cyanoethylpullulan was used in the formation of a gate insulating film and the resulting gate insulating film had a thickness of 1,090 nm and a single layer structure. In Comparative example 1 as well, three field-effect transistors related to Samples 4 and 5 having the same structure were prepared at the same time.

(4) Evaluation

Figure 8:
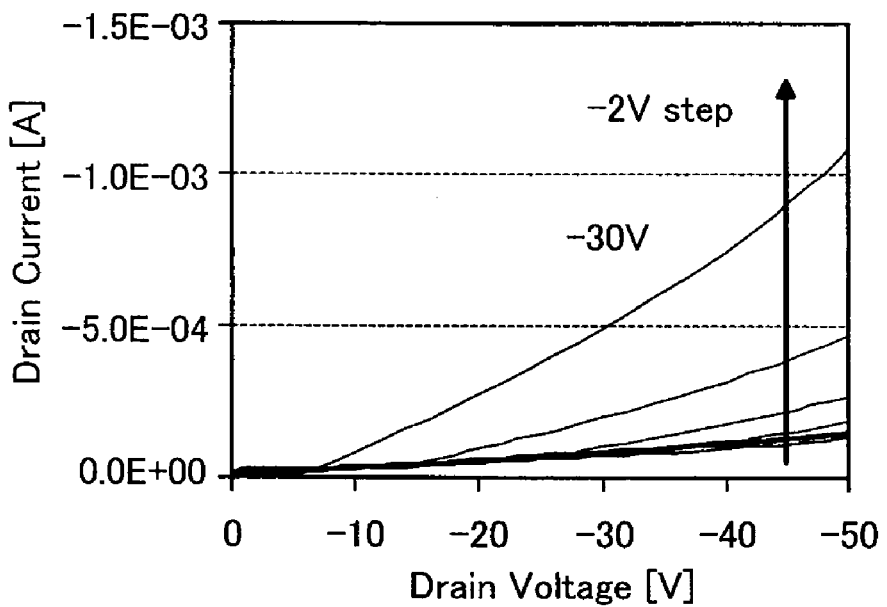
FIG. 8 is a diagram showing an output characteristic of a field-effect transistor according to Comparative example 1.

The current-voltage characteristic of the resulting field-effect transistor was measured in a manner similar to that in Example 1 so as to obtain the output characteristic shown in FIG. 8.

In this output characteristic, a clear saturation region did not appear. Therefore, a field-effect mobility and a threshold voltage in a saturation region were not able to be calculated. Furthermore, the value corresponding to the on-off ratio was a small 31.

Furthermore, Table 3 described below shows variations between field-effect transistors related to Samples 4 to 6 prepared at the same time.

TABLE 3

| Sample No. | Gate voltage at minimum drain current (V) | Minimum value of drain current (A) |
| --- | --- | --- |
| 4 | −22 | $9.1 \times 10^{-6}$ |
| 5 | 2 | $2.2 \times 10^{-4}$ |
| 6 | −16 | $5.8 \times 10^{-7}$ |

1-3. COMPARATIVE EXAMPLE 2

(1) Formation of Gate Insulating Film to (3) Formation of Source and Drain Electrodes A field-effect transistor was prepared in a manner similar to that in Example 1 except that merely polydichloro-p-xylylene was used in the formation of a gate insulating film and the resulting gate insulating film had a thickness of 880 nm and a single layer structure.

(4) Evaluation

Figure 9:
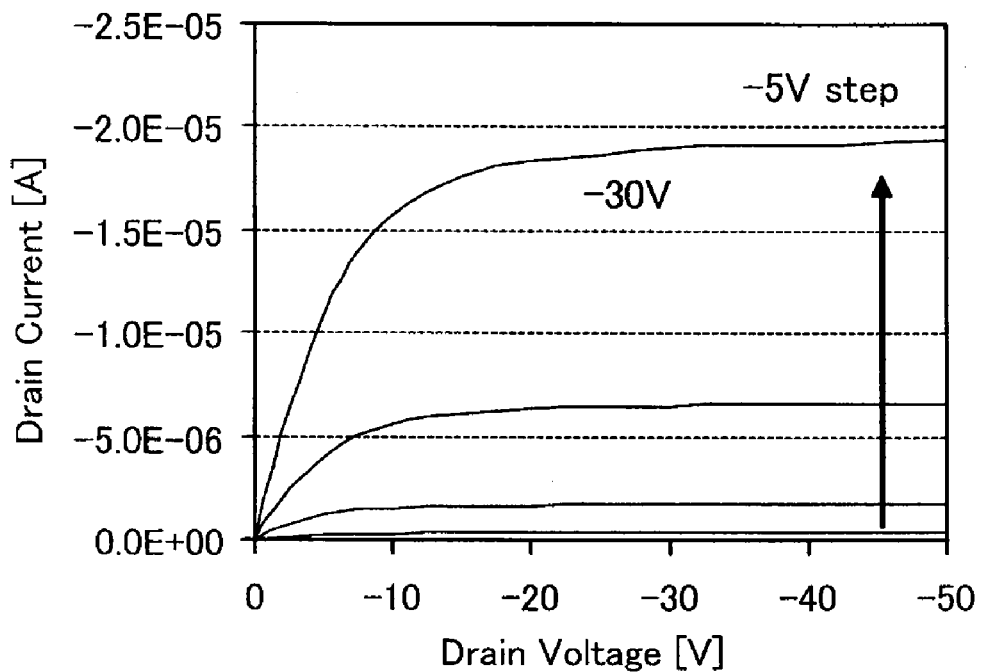
FIG. 9 is a diagram showing an output characteristic of a field-effect transistor according to Comparative example 2.
Figure 10:
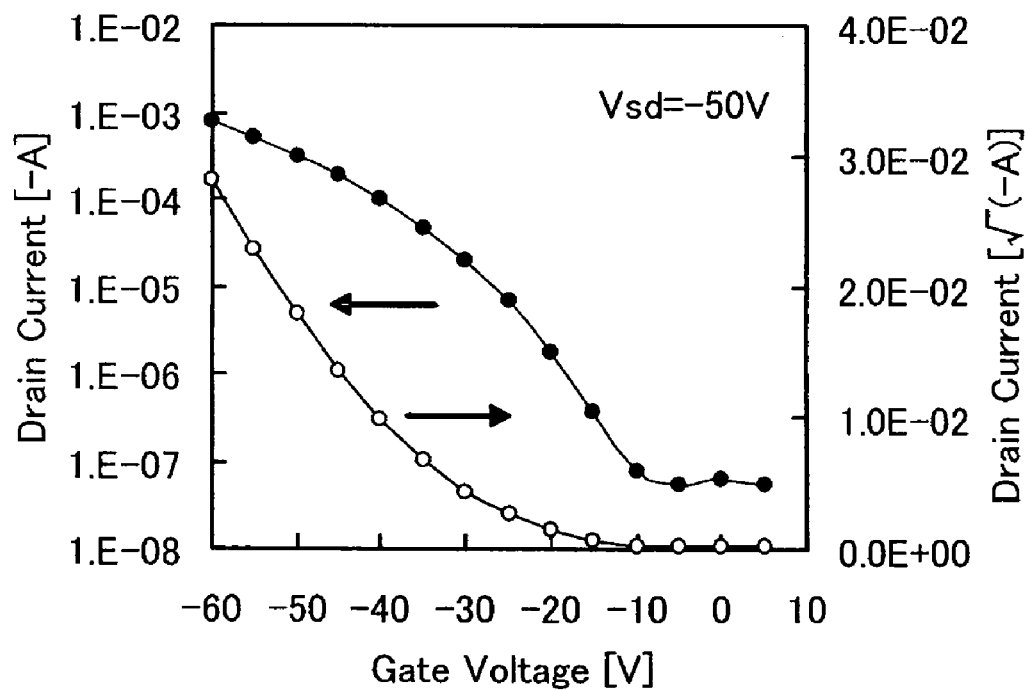
FIG. 10 is a diagram showing a transfer characteristic of the field-effect transistor according to Comparative example 2.

The current-voltage characteristic of the resulting field-effect transistor was measured in a manner similar to that in Example 1 so as to obtain the output characteristic shown in FIG. 9 and the transfer characteristic shown in FIG. 10.

The same calculation as in Example 1 was conducted and, thereby, the field-effect mobility μFET=0.16 cm²/Vs and the threshold voltage $V_t$=−29.7 V were obtained. Furthermore, the on-off ratio was $1.2 \times 10^4$.

1-4. Discussion

TABLE 4

| | Semiconductor film | Gate insulating film | | Threshold voltage (V) | On-off ratio | Variation between samples |
|---|---|---|---|---|---|---|
| | | Second insulating layer (relative dielectric constant) | First insulating layer (relative dielectric constant) | | | |
| Example 1 | pentacene | cyanoethylpullulan (15.4) | polydichloro-p-xylylene (3.2) | −5.4 | $3.7 \times 10^4$ | small |
| Comparative example 1 | pentacene | cyanoethylpullulan (15.4) | — | calculation was impossible | 31 | large |
| Comparative example 2 | pentacene | polydichloro-p-xylylene (3.2) | — | −29.7 | $1.2 \times 10^4$ | small |

Regarding each of the above-described Example 1 and Comparative examples 1 and 2, Table 4 shows the material for each of the semiconductor film, the second insulating layer, and the first insulating layer, the threshold voltage, the on-off ratio, and variations between samples. Furthermore, regarding each of the materials for the second insulating layer and the first insulating layer, the relative dielectric constant is shown in parentheses. Besides, regarding variations between samples, three samples were prepared by the same method, and regarding them, in the case where a difference between the sample exhibiting a minimum gate voltage value at a minimum drain current and the sample exhibiting a maximum gate voltage value became 5 V or less, the evaluation result was "small", and in the case where the difference became 20 V or more, the evaluation result was "large" (refer to Table 2 and Table 3).

In Comparative example 1, merely cyanoethylpullulan was used for the gate insulating film. Therefore, as shown in FIG. 8, no saturation region appeared. On the other hand, according to Example 1, as shown in FIG. 6, the field-effect transistor exhibiting a large on-off ratio was obtained because in the gate insulating film, not only the second insulating layer composed of cyanoethylpullulan, but also the first insulating layer composed of poly-p-xylylene was formed. Furthermore, regarding Example 1, the threshold voltage was reduced to one-fifth or less of the threshold voltage of Comparative example 2 in which merely poly-p-xylylene was used for the gate insulating film. Moreover, according to Example 1, variations in characteristic values between samples were small and, therefore, a stable field-effect transistor was able to be obtained.

Consequently, it is estimated that ionic impurities contained in cyanoethylpullulan constituting the second insulating layer were blocked by the first insulating layer composed of poly-p-xylylene and, thereby, the on-off ratio increased.

Moreover, it is estimated that in Example 1, the first insulating layer composed of poly-p-xylylene was thinner than the second insulating layer composed of cyanoethylpullulan, the dielectric constant of the whole gate insulating film was high and, thereby, the threshold voltage was lowered.

On the other hand, in Comparative example 2, since the dielectric constant of poly-p-xylylene constituting the gate insulating film was low, a smaller current was passed as compared with that in Example 1 at the same gate voltage and, thereby, the threshold voltage was high.

2. EXPERIMENTAL EXAMPLE 2

In Experimental example 2, a polyfluorene-thiophene copolymer (F8T2) was used as the material for a semiconductor film, and a sample related to each of Example 2 within the scope of the present invention and Comparative examples 3 and 4 out of the scope of the present invention was prepared.

2-1. EXAMPLE 2

(1) Formation of Gate Insulating Film

A second insulating layer having a thickness of 1,000 nm composed of cyanoethylpullulan was formed on a glass substrate provided with a gate electrode formed from gold in a manner similar to that in Example 1.

A first insulating layer having a thickness of 200 nm composed of polydichloro-p-xylylene was formed on the above-described second insulating layer by the CVD method, in which dichloro(2,2)-p-cyclophane was used as a raw material, at a reduced pressure of about $1.0 \times 10^{-2}$ Pa under the condition that the vaporization temperature of the source material was 125° C., the decomposition temperature was 630° C., and the substrate temperature was 40° C.

(2) Formation of Semiconductor Film

The above-described first insulating layer was spin-coated with a 0.6 percent by weight chloroform solution of polyfluorene-thiophene copolymer (F8T2), and a heat treatment was conducted at 60° C. for 30 minutes, so that a semiconductor film having a thickness of 50 nm was formed.

(3) Formation of Source and Drain Electrodes

A source electrode and a drain electrode which had thicknesses of 30 nm were formed on the above-described semiconductor film in a manner similar to that in Example 1 and, thereby, a field-effect transistor was obtained.

(4) Evaluation

Figure 11:
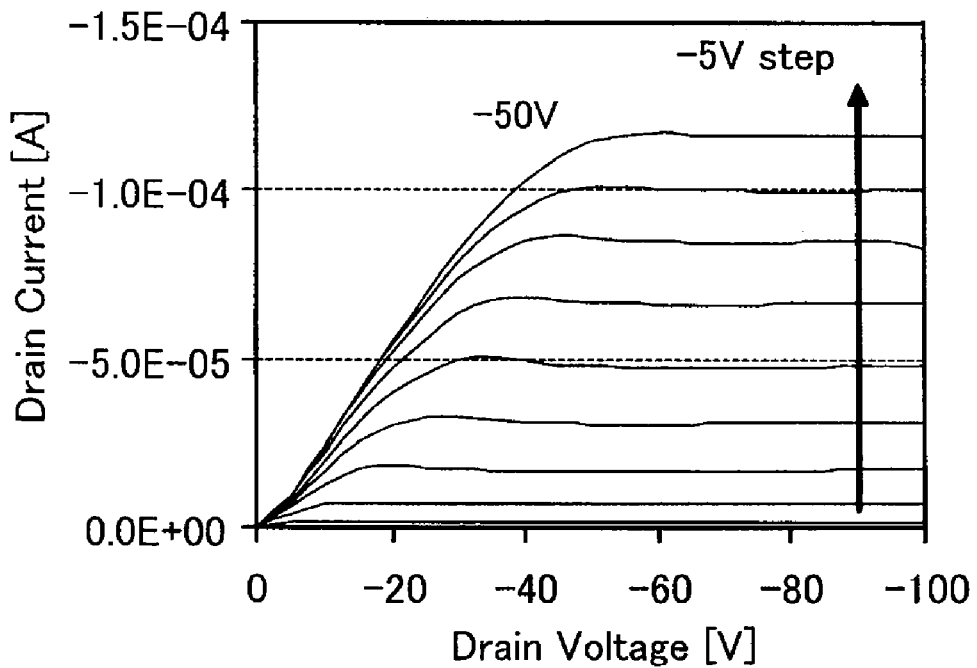
FIG. 11 is a diagram showing an output characteristic of a field-effect transistor according to Example 2.
Figure 12:
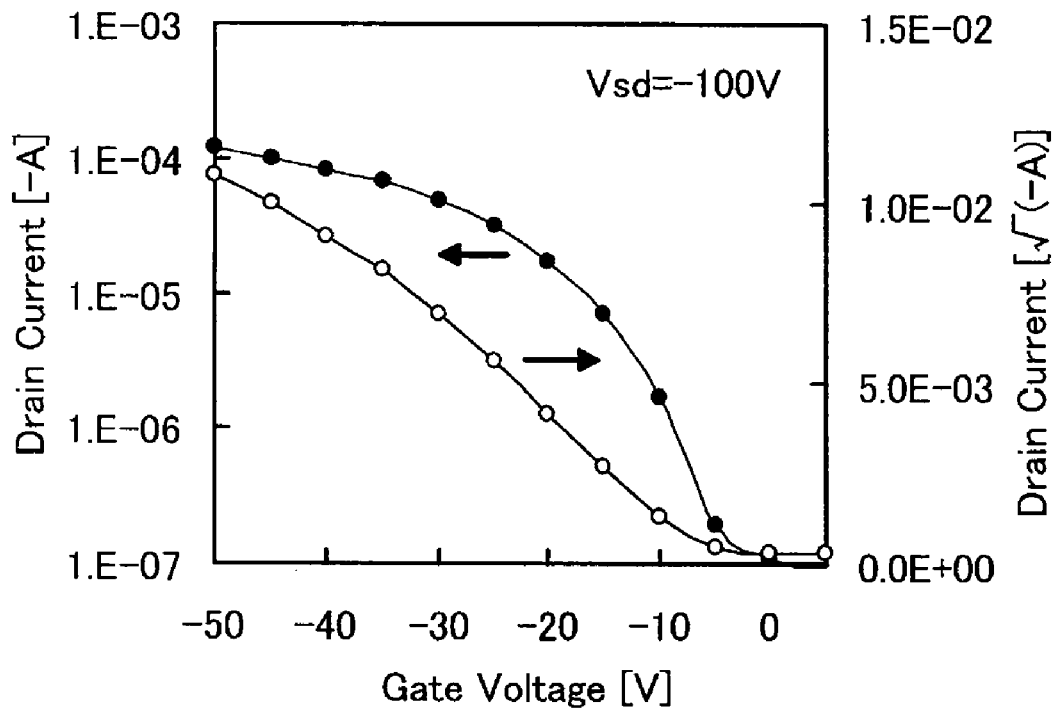
FIG. 12 is a diagram showing a transfer characteristic of the field-effect transistor according to Example 2.

The current-voltage characteristic of the resulting field-effect transistor was measured in a manner similar to that in Example 1 so as to obtain the output characteristic shown in FIG. 11 and the transfer characteristic shown in FIG. 12. The same calculation as in Example 1 was conducted and, thereby, values of the field-effect mobility μFET=$5.3 \times 10^{-3}$ cm²/Vs and the threshold voltage $V_t$=−3.0 V were obtained. Furthermore, the on-off ratio was $1.1 \times 10^3$.

2-2. COMPARATIVE EXAMPLE 3

(1) Formation of Gate Insulating Film to (3) Formation of Source and Drain Electrodes A field-effect transistor was prepared in a manner similar to that in Example 2 except that merely cyanoethylpullulan was used in the formation of a gate insulating film and the resulting gate insulating film had a thickness of 1,230 nm and a single layer structure.

(4) Evaluation

Figure 13:
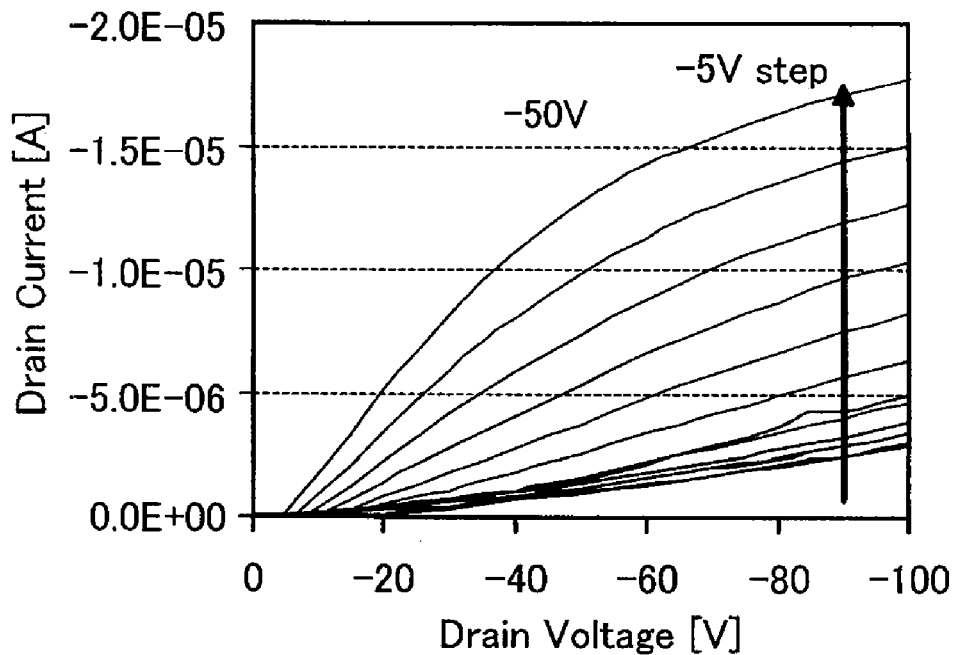
FIG. 13 is a diagram showing an output characteristic of a field-effect transistor according to Comparative example 3.

The current-voltage characteristic of the resulting field-effect transistor was measured in a manner similar to that in Example 1 so as to obtain the output characteristic shown in FIG. 13.

In this output characteristic, a clear saturation region did not appear. Therefore, a field-effect mobility and a threshold voltage in a saturation region were not able to be calculated. Furthermore, the value corresponding to the on-off ratio was a small 20.

2-3. COMPARATIVE EXAMPLE 4

(1) Formation of Gate Insulating Film to (3) Formation of Source and Drain Electrodes A field-effect transistor was prepared in a manner similar to that in Example 2 except that merely polydichloro-p-xylylene was used in the formation of a gate insulating film and the resulting gate insulating film had a thickness of 550 nm and a single layer structure.

(4) Evaluation

Figure 14:
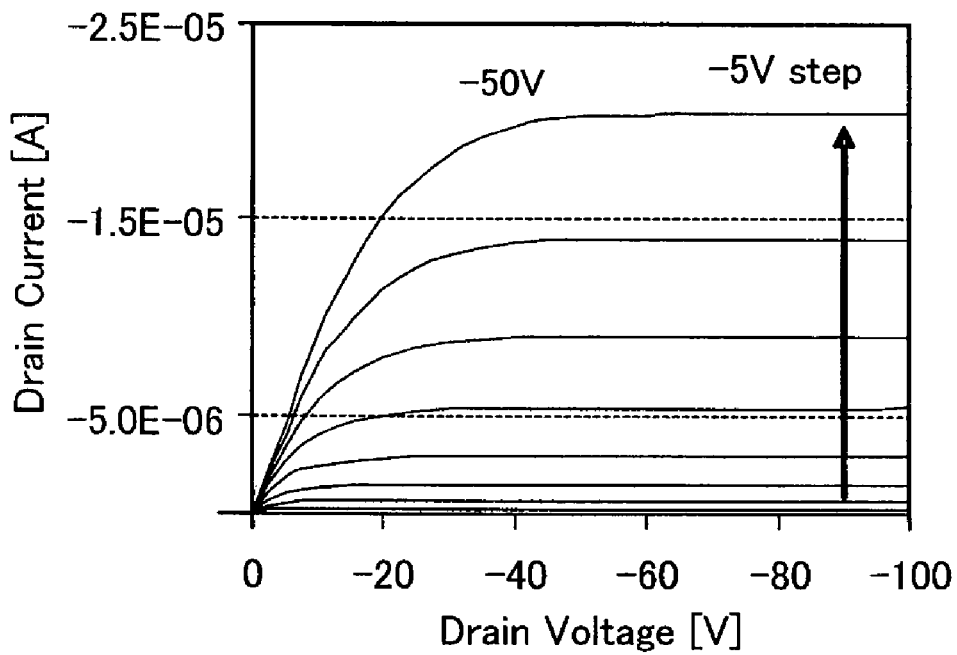
FIG. 14 is a diagram showing an output characteristic of a field-effect transistor according to Comparative example 4.
Figure 15:
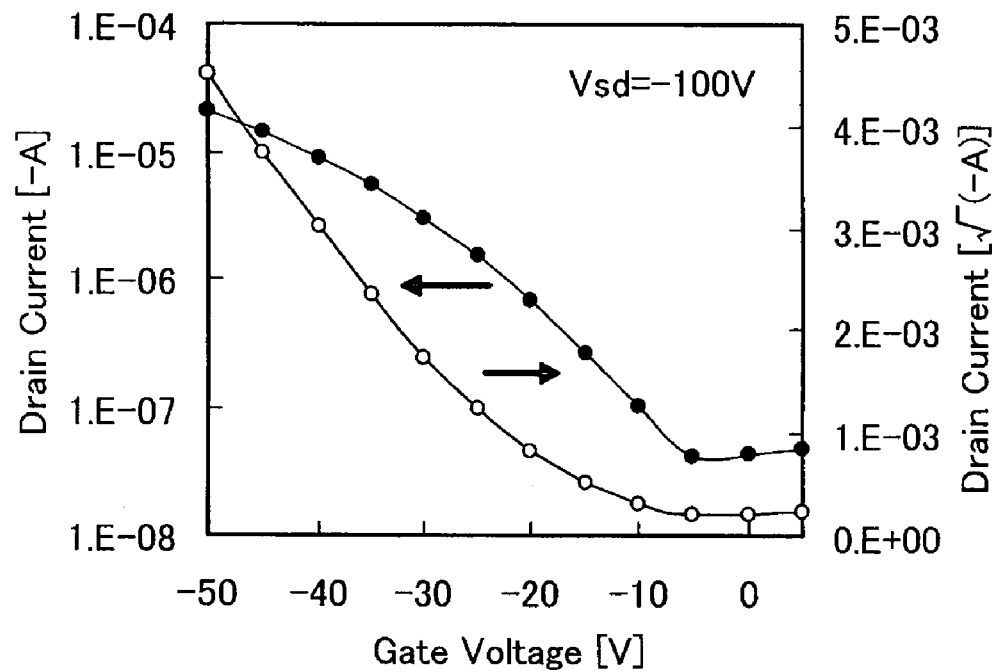
FIG. 15 is a diagram showing a transfer characteristic of the field-effect transistor according to Comparative example 4.

The current-voltage characteristic of the resulting field-effect transistor was measured in a manner similar to that in Example 1 so as to obtain the output characteristic shown in FIG. 14 and the transfer characteristic shown in FIG. 15.

The same calculation as in Example 1 was conducted and, thereby, the field-effect mobility $\mu FET=2.4\times10^{-3}$ cm$^2$/Vs and the threshold voltage $V_t=-19.5$ V were obtained. Furthermore, the on-off ratio was $4.7\times10^2$.

2-4. Discussion vent was low, components of the gate insulating film were not dissolved nor mixed into a channel portion of the semiconductor film.

3. EXPERIMENTAL EXAMPLE 3

In Experimental example 3, pentacene was used as the material for a semiconductor film, a resin containing a metal oxide powder was used for the second insulating layer, and a sample related to Example 3 within the scope of the present invention was prepared.

3-1. EXAMPLE 3

(1) Formation of Gate Insulating Film

A barium titanate-cyanoethylpullulan dispersion was prepared by adding 1.5 g of barium titanate powder (average particle diameter 40 nm) to 5 g of solution (15 percent by weight) in which cyanoethylpullulan was dissolved into dimethylformamide:acetone=9:1 (weight ratio), conducting grinding and, thereafter removing coarse particles through decantation.

Subsequently, a glass substrate provided with a gate electrode formed from gold was spin-coated with the above-described dispersion. Thereafter, heating was conducted at 100° C. for 1 hour so as to form a second insulating layer having a thickness of 930 nm composed of barium titanate-containing cyanoethylpullulan. The relative dielectric constant of barium titanate-containing cyanoethylpullulan was 29.6 at 1 kHz.

Then, a first insulating layer having a thickness of 300 nm composed of polydichloro-p-xylylene was formed on the above-described second insulating layer in a manner similar to that in Example 2.

(2) Formation of Semiconductor Film

A semiconductor film having a thickness of 40 nm was formed on the above-described first insulating layer in a manner similar to that in Example 1.

TABLE 5

| | | Gate insulating film | | | |
|---|---|---|---|---|---|
| | Semiconductor film | Second insulating layer (relative dielectric constant) | First insulating layer (relative dielectric constant) | Threshold voltage (V) | On-off ratio | Variation between samples |
| Example 2 | F8T2 | cyanoethylpullulan (15.4) | polydichloro-p-xylylene (3.2) | −3.0 | $1.1 \times 10^3$ | small |
| Comparative example 3 | F8T2 | cyanoethylpullulan (15.4) | — | calculation was impossible | 20 | large |
| Comparative example 4 | F8T2 | polydichloro-p-xylylene (3.2) | — | −19.5 | $4.7 \times 10^2$ | small |

Regarding each of the above-described Example 2 and Comparative examples 3 and 4, Table 5 shows the material for each of the semiconductor film, the second insulating layer, and the first insulating layer, the threshold voltage, the on-off ratio, and variations between samples. The same evaluation method as that in the case of Table 4 described above was applied to the variations between samples.

According to Example 2, the same effects as those in Example 1 described above were obtained.

In Experimental example 2, for the purpose of forming the semiconductor film, chloroform was used as a solvent of the semiconductor solution. Since the solubility of polydichloro-p-xylylene constituting the first insulating layer into the sol- (3) Formation of Source and Drain Electrodes A source electrode and a drain electrode which had thicknesses of 30 nm were formed on the above-described semiconductor film in a manner similar to that in Example 1 and, thereby, a field-effect transistor was obtained.

(4) Evaluation

Figure 16:
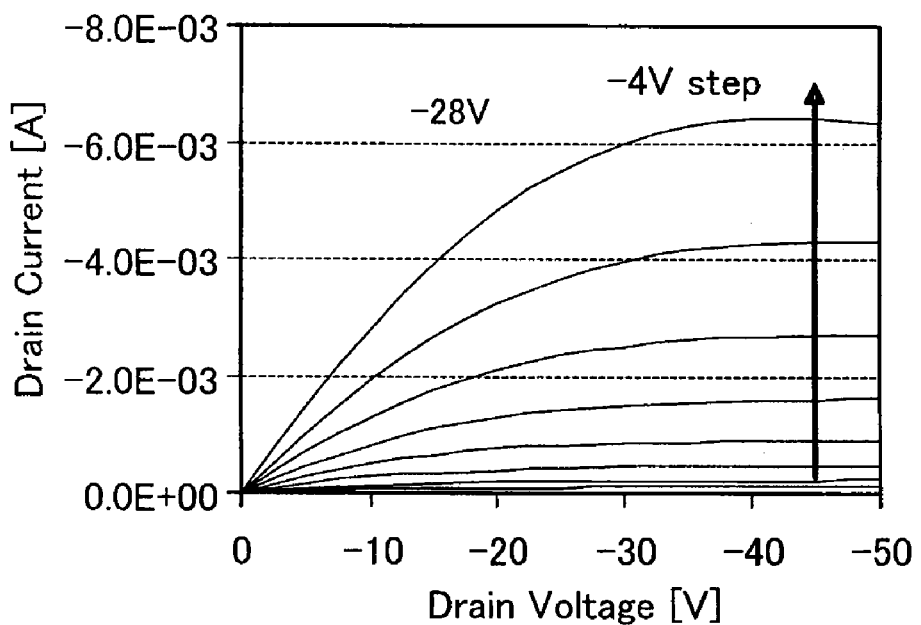
FIG. 16 is a diagram showing an output characteristic of a field-effect transistor according to Example 3.
Figure 17:
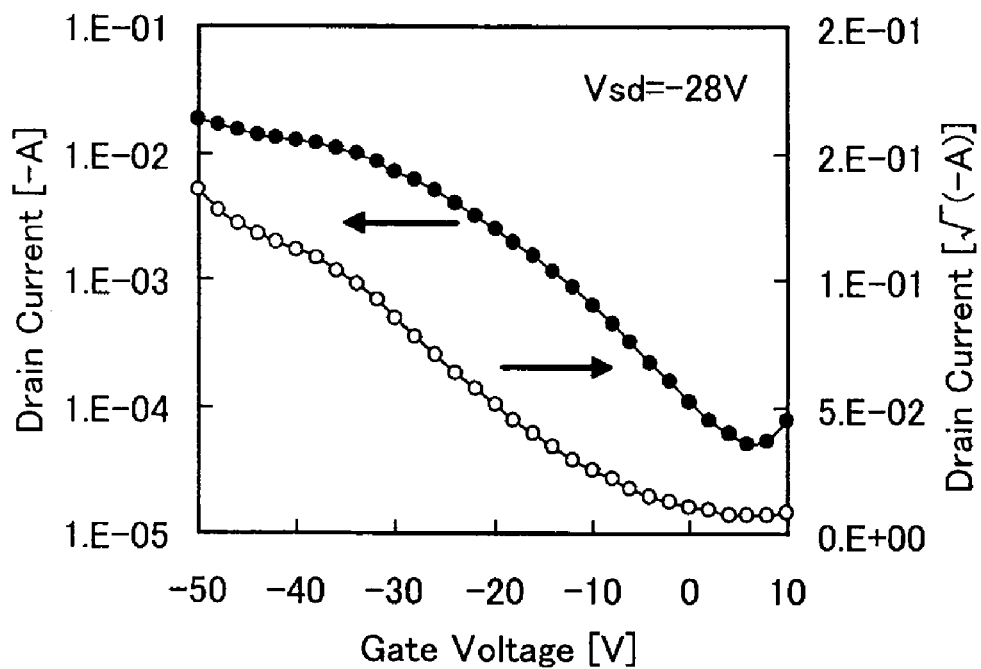
FIG. 17 is a diagram showing a transfer characteristic of the field-effect transistor according to Example 3.

The current-voltage characteristic of the resulting field-effect transistor was measured in a manner similar to that in Example 1 so as to obtain the output characteristic shown in FIG. 16 and the transfer characteristic shown in FIG. 17.

The same calculation as in Example 1 was conducted and, thereby, the field-effect mobility μFET=0.65 cm$^2$/Vs and the threshold voltage V$_t$=−3.0 V were obtained. Furthermore, the on-off ratio was 1.7×10$^2$.

3-2. Discussion

TABLE 6

| | | Gate insulating film | | | |
|---|---|---|---|---|---|
| | Semiconductor film | Second insulating layer (relative dielectric constant) | First insulating layer (relative dielectric constant) | Threshold voltage (V) | On-off ratio | Variation between samples |
| Example 3 | pentacene | barium titanate-containing pullulan (29.6) | polydichloro-p-xylylene (3.2) | −3.0 | 1.1 × 10$^2$ | small |

Regarding Example 3 described above, Table 6 shows the material for each of the semiconductor film, the second insulating layer, and the first insulating layer, the threshold voltage, the on-off ratio, and variations between samples. The same evaluation method as that in the case of Table 4 described above was applied to the variations between samples.

According to Example 3, the same effects as those in Example 1 were obtained. In addition, since the second insulating layer contained a high dielectric constant barium titanate powder, the dielectric constant of the whole gate insulating film increased, and the threshold voltage was lowered than that in Example 1.

4. EXPERIMENTAL EXAMPLE 4

In Experimental example 4, an influence exerted by the thickness of the first insulating layer was examined. For that purpose, the following sample related to Example 4 within the scope of the present invention was prepared. That is, a field-effect transistor related to Example 4 having the same structure as the structure in Example 1 was prepared in a manner similar to the manner in Example 1 except that the thickness of the first insulating layer was specified to be 20 nm. The current-voltage characteristic of the resulting field-effect transistor was measured in a manner similar to that in Example 1 so as to obtain the output characteristic shown in FIG. 18.

Figure 18:
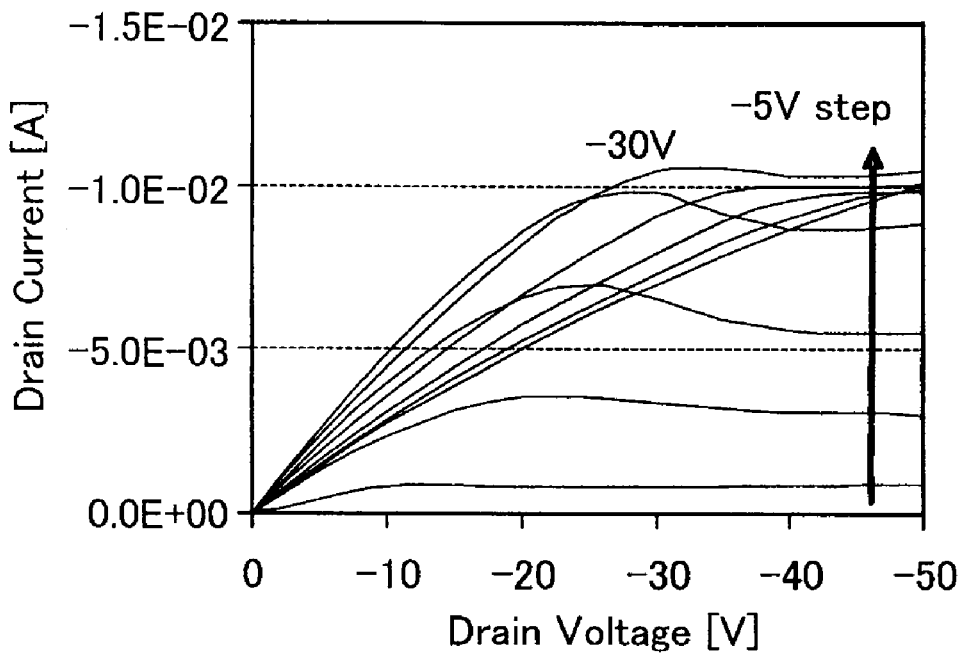
FIG. 18 is a diagram showing an output characteristic of the field-effect transistor according to Example 4.

As is clear from comparison between FIG. 18 and FIG. 8 corresponding to Comparative example 1, regarding the output characteristic in Example 4, a saturation region appears to some extent. However, it is clear from comparison with FIG. 6 corresponding to Example 1 that a stable saturation current is not obtained. The reason for this is estimated that the first insulating layer having a thickness of 20 nm, which is less than 50 nm, did not cover the second insulating layer satisfactorily.

Consequently, it is clear that the thickness of the first insulating layer is preferably 50 nm or more.

Although particular embodiments have been described, many other variations and modifications and other uses will become apparent to those skilled in the art. Therefore, the present invention is not limited by the specific disclosure herein.

What is claimed is:

1. A field-effect transistor comprising:
   a gate electrode;
   a source electrode;
   a drain electrode;
   a semiconductor film which is disposed in such a way as to contact the source electrode and the drain electrode and which is formed from an organic semiconductor material;
   a gate insulating film disposed between the gate electrode and the semiconductor film; and
   a substrate for holding the gate electrode, the source electrode, the drain electrode, the semiconductor film, and the gate insulating; wherein
   the gate insulating film is provided with a plurality of insulating layers including at least a first insulating layer and a second insulating layer, the first insulating layer being arranged so as to contact the semiconductor film;
   the first insulating layer is defined by a film of chemical vapor deposited poly-p-xylylene material;
   the second insulating layer has a dielectric constant higher than that of the first insulating layer; and
   the second insulating layer includes a resin including a metal oxide powder.

2. The field-effect transistor according to claim 1, wherein the second insulating layer has a thickness greater than that of the first insulating layer.

3. The field-effect transistor according to claim 1, wherein the resin of the second insulating layer comprises cyanoethyl pullulan.

4. The field-effect transistor according to any one of claims 2, and 3, wherein the thickness of the first insulating layer is 50 nm or more.

5. A method of manufacturing a field-effect transistor comprising the steps of:
   disposing on a substrate a gate electrode; a source electrode; a drain electrode; a semiconductor film which is disposed in such a way as to contact the source electrode and the drain electrode and which is formed from an organic semiconductor material; and a gate insulating film disposed between the gate electrode and the semiconductor film;
   forming the gate insulating film with a plurality of insulating layers including at least a first insulating layer and a second insulating layer, the first insulating layer being arranged so as to contact the semiconductor film;
   forming the first insulating layer from poly-p-xylylene formed into a film by chemical vapor deposition;
   forming the second insulating layer to have a dielectric constant higher than that of the first insulating layer and to include a resin including a metal oxide powder.

6. The method according to claim 5, wherein the second insulating layer has a thickness greater than that of the first insulating layer.

7. The method according to claim 5, wherein the resin of the second insulating layer comprises cyanoethyl pullulan.

8. The method according to claim 5, wherein the thickness of the first insulating layer is 50 nm or more.

* * * * *